United States Patent
Yoo et al.

(10) Patent No.: US 10,048,286 B2
(45) Date of Patent: Aug. 14, 2018

(54) WAFER LEVEL PACKAGE OF MEMS SENSOR AND METHOD FOR MANUFACTURING THE SAME

(71) Applicant: Hyundai Motor Company, Seoul (KR)

(72) Inventors: Il Seon Yoo, Seoul (KR); Hi Won Lee, Seoul (KR); Soon Myung Kwon, Seoul (KR); Hyun Soo Kim, Seoul (KR)

(73) Assignee: Hyundai Motor Company, Seoul (KR)

( * ) Notice: Subject to any disclaimer, the term of this patent is extended or adjusted under 35 U.S.C. 154(b) by 0 days.

(21) Appl. No.: 14/461,937

(22) Filed: Aug. 18, 2014

(65) Prior Publication Data

US 2015/0166328 A1  Jun. 18, 2015

(30) Foreign Application Priority Data

Dec. 18, 2013  (KR) .................. 10-2013-0158742

(51) Int. Cl.
*G01R 31/26* (2014.01)
*H01L 21/66* (2006.01)
(Continued)

(52) U.S. Cl.
CPC ............ *G01P 3/42* (2013.01); *B81C 1/00269* (2013.01); *G01C 19/5783* (2013.01); *G01P 15/0802* (2013.01); *B81C 2203/0118* (2013.01)

(58) Field of Classification Search
CPC ............................ B81B 7/007; B81C 1/00269
(Continued)

(56) References Cited

U.S. PATENT DOCUMENTS

2007/0103009 A1  5/2007  Yang et al.
2007/0161158 A1  7/2007  Shao et al.
(Continued)

FOREIGN PATENT DOCUMENTS

JP  2004-333133 A  11/2004
JP  2012156401 A   8/2012
(Continued)

OTHER PUBLICATIONS

Machine translation of Taura et al., JP 2012156401, Aug. 16, 2012.*
(Continued)

*Primary Examiner* — Hsin-Yi Hsieh
(74) *Attorney, Agent, or Firm* — Mintz Levin Cohn Ferris Glovsky and Popeo, P.C.; Peter F. Corless

(57) ABSTRACT

A MEMS sensor and a manufacturing method thereof is provided: forming a lower electrode layer wherein a metal is deposited on a portion of a lower glass substrate; forming a structural layer by etching according to a pattern which is formed on an upper surface of a silicon wafer and then further etching to the same thickness as the metal which is formed on a portion of the lower electrode layer; anodic bonding the structural layer to an upper portion of the lower electrode layer formed; forming a sensing part in the structural layer by etching according to a pattern which is formed on an opposite surface of the structural layer which is not etched; and forming an upper electrode layer by depositing a metal on an upper wafer and eutectic bonding the upper electrode layer to the structural layer on which the sensing part is formed.

3 Claims, 17 Drawing Sheets

(51) Int. Cl.
*G01P 3/42* (2006.01)
*B81C 1/00* (2006.01)
*G01P 15/08* (2006.01)
*G01C 19/5783* (2012.01)

(58) Field of Classification Search
USPC .......................................................... 438/50
See application file for complete search history.

(56) References Cited

U.S. PATENT DOCUMENTS

| | | |
|---|---|---|
| 2007/0161210 A1 | 7/2007 | Shao et al. |
| 2007/0218584 A1 | 9/2007 | Chen |
| 2008/0311375 A1* | 12/2008 | Harnack ............... B01D 67/003 428/315.7 |
| 2010/0224004 A1 | 9/2010 | Suminto et al. |
| 2013/0285171 A1 | 10/2013 | Najafi et al. |
| 2014/0264661 A1* | 9/2014 | Cheng ................... B81C 3/001 257/417 |

FOREIGN PATENT DOCUMENTS

| | | |
|---|---|---|
| KR | 10-2001-0045332 | 6/2001 |
| KR | 10-2007-0015861 | 2/2007 |
| KR | 10-2010-0092914 | 8/2010 |
| KR | 10-2012-0054126 | 5/2012 |

OTHER PUBLICATIONS

Notice of Allowance dated Sep. 26, 2014 in corresponding Korean Patent Application No. KR 10-2013-0158742.
Office Action for German patent application No. 10 2014 216 746.9, dated Feb. 22, 2018 by German Patent Office, 7 pages.

* cited by examiner

WAFER LEVEL PACKAGE OF MEMS SENSOR AND METHOD FOR MANUFACTURING THE SAME

CROSS-REFERENCE(S) TO RELATED APPLICATION

The present claims priority of Korean Patent Application Number 10-2013-0158742 filed on Dec. 18, 2013, the entire contents of which are incorporated herein for all purposes by this reference.

BACKGROUND

Technical Field

The present disclosure relates to a wafer level package of a Micro-Electro Mechanical Systems (MEMS) sensor and a method for manufacturing the same, and more specifically, to a wafer level package of a MEMS sensor and a method for manufacturing the same wherein interference can be removed when bonding a MEMS structural layer to a lower and an upper electrode layers.

Background Art

MEMS (Micro Electro-Mechanical System) refers to a micro-miniature electronic mechanical element technology which ranges in size from millimeters to micrometers based on a process technology of semiconductor. A MEMS element generally consists of a driving part including a mechanical structure and a control part including an electric circuit. In particular, its performance stability is known to deteriorate due to an influence from external moisture and dust. Additionally, as in an angular velocity sensor, when high speed operation of a driving part is required, the element performance may deteriorate due to a damping effect by the resistance of the air inside of the element. Accordingly, a hermetic sealing thereof is essential in order to minimize the influence of external factors.

Some known hermetic sealing technologies that are used at wafer level include anodic bonding, eutectic bonding, etc. Anodic bonding is used for bonding a glass to silicon, in which temperature and voltage are applied to an upper wafer and a lower wafer to bond the surface tightly. Products that are anodicly bonded have excellent sealing properties and high boding strength. Eutectic bonding is used for bonding wafers to an eutectic alloy, such as an interlayer. In eutectic bonding, the bonding temperature is low and a stress from thermal expansion is low relatively.

Recently, with a trend of downsizing of electronic device, MEMS elements have been required to be packaged at a higher density. However, conventional technology of packaging a plurality of elements on a substrate has limitations. Specifically, in case of elements where a high speed operation is performed like an angular sensor, when foreign matters are attached to the element while dicing the wafer that has been processed, its performance may deteriorate. In order to overcome these drawbacks, a stacked type packaging technology capable of stacking a plurality of wafers in a three dimensional way is required.

The description provided above as a related art of the present invention is just for helping in understanding the background of the present invention and should not be construed as being included in the related art known by those skilled in the art.

SUMMARY OF THE DISCLOSURE

The present invention has been proposed to solve the above drawbacks and one object of the present invention is to provide a wafer level package of a MEMS sensor and a method for manufacturing the same capable of packaging three story wafers using a double bonding technique wherein an anodic bonding and an eutectic bonding are combined.

In order to achieve the above object, a method of manufacturing a wafer level package of a MEMS sensor according to the present invention is provided. In particular, a lower electrode layer is formed wherein a metal is deposited on a part of a lower glass substrate and a structural layer is formed by etching a silicon wafer according to a pattern which is formed on an upper surface of the silicon wafer and then further etching the silicon wafer to a same thickness as the metal which is formed on a part of the lower electrode layer. Next, the g the structural layer is anodic bonded to an upper part of the formed lower electrode layer and a sensing part is formed in the structural layer by etching according to a pattern which is formed on an opposite surface of the structural layer which is not etched. Subsequently, an upper electrode layer is formed by depositing a metal on an upper wafer and the upper electrode layer is eutectic bonded to the structural layer on which the sensing part is formed.

More specifically, the step of forming the structural layer may include etching so that the height of a part of the structural layer, with which a part of the lower electrode on which the metal is formed is in contact, is different from the height of another part of the structural layer with which a part of the lower electrode on which the metal is not formed is in contact.

The step of forming the sensing part may further include a step of etching by forming a pattern identical to a pattern formed on an upper surface of the silicon wafer on a part which is not anodic bonded among the structural layer. Additionally, the step of forming the sensing part may be performed by forming a pattern of the sensing part on the part that is etched and etching according to the pattern formed.

In some exemplary embodiments, the upper electrode layer formed by depositing a metal on the wafer may be formed by etching along a pattern which is formed on the upper wafer and depositing a metal on the upper part of the plating layer for plating the upper wafer etched. In addition, the step of eutectic bonding with the structural layer may be performed by eutectic bonding the upper electrode layer to one surface of the structural layer on which the sensing part is formed.

As such, the above wafer level package of a MEMS sensor may include: a lower electrode layer wherein a metal is formed on a part of a glass substrate; a structural layer which is formed by etching according to a pattern formed on an upper surface of a silicon wafer and then additionally etching to the same thickness as a metal formed on the lower electrode layer, and is anodic bonded to the lower electrode layer; a sensing part formed in the structural layer by etching according to a pattern which is formed on an opposite surface of a part that is not etched among the structural layer; and an upper electrode layer which a metal is formed on the silicon wafer and is eutectic bonded to the structural layer on which the sensing part is formed.

The wafer level package of a MEMS sensor may further include a plating layer which is formed between the silicon wafer and the metal formed on the silicon wafer.

DETAILED DESCRIPTION

Figure 1:
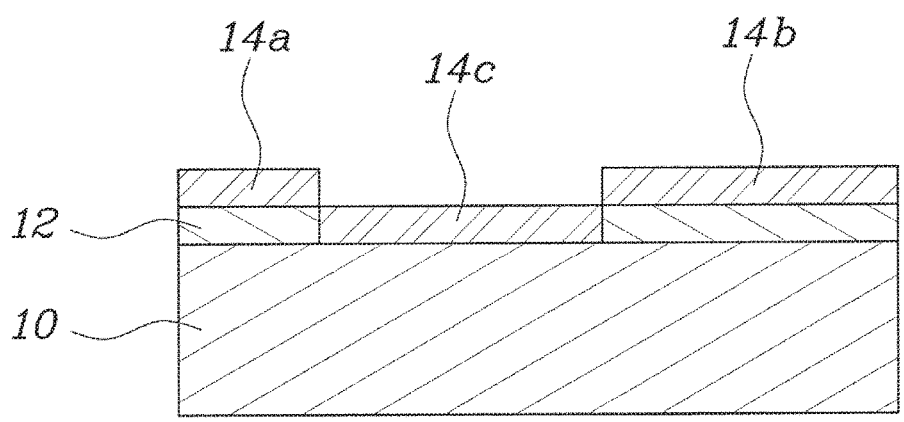
FIGS. 1 to 17 are views showing the method for manufacturing a wafer level package of a MEMS (Micro Electro

The special configurations and functional descriptions are merely exemplary for describing the embodiments according to the present invention, and further the embodiments of the present invention may be replaced by various modifications, and thus it should not be construed as limiting thereto.

The embodiments according to a concept of the present invention may be changed variously and have various types and thus the special embodiments will be illustrated in the drawings and described in the specification. However, the embodiments according to a concept of the present invention are not limited to the specifically disclosed types and thus it should be understood that it includes all modifications and equivalents or replacements included within a spirit and a scope of the present invention.

Although terms like a first and a second are used to describe various components, but the components are not limited to these terms. These terms are used only to differentiate one component from another one, for example, the first component can be referred to as the second component, or the second component can be referred to as the first component, without departing from the scope of the present invention.

It also should be understood that when it is stated that one component is "connected or "coupled to another component, even though the one component may be directly connected or coupled to another component, but there may be other components between them. However, it has to be understood that when it is stated that one component is "directly connected" or "directly coupled" to another component, there is no intermediate component between them. The terms used for describing a relation among other components, that is, "between", "right between", "adjacent to" or "directly adjacent to" should be construed similarly.

The terminology used herein is for the purpose of describing particular embodiments only and is not intended to be limiting to the embodiments. As used herein, unless otherwise defined, the singular forms "a," "an" and "the" are intended to include the plural forms as well. Unless the context indicates otherwise, it will be further understood that the terms "comprises" and/or "having" when used in this specification, specify the presence of stated features, integers, steps, operations, elements, and/or components, but do not preclude the presence or addition of one or more other features, integers, steps, operations, elements, components, parts or combination thereof.

All terms including technical or scientific terminology used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, reference numerals will now be made in detail to various embodiments of the present invention, examples of which are illustrated in the accompanying drawings and described below. In the drawings, the same reference numerals refer to the same components.

FIGS. 1 to 17 are views showing the method for manufacturing a wafer level package of a MEMS (Micro Electro Mechanical Systems) sensor according to an exemplary embodiment of the present invention.

The method for manufacturing a wafer level package of a MEMS (Micro Electro Mechanical Systems) sensor according to an exemplary embodiment of the present invention may for example include: forming a lower electrode layer 100 on which a first metal 14c is deposited on a portion of a lower glass substrate 10; forming a structural layer 200 by etching a silicon wafer 20 according to a pattern 22a which is formed on an upper surface of the silicon wafer 20 and then further etching the silicon wafer 20 to a same thickness as the metal 14c which is formed on a portion of the lower electrode layer 100; anode-bonding the structural layer 200 to an upper portion of the formed lower electrode layer 100; forming a sensing part 50 in the structural layer 200 by etching according to a pattern 22c which is formed on an opposite surface of the structural layer 200 which is not etched; and forming an upper electrode layer 300 by depositing a metal 34a on an upper wafer 30 and eutectic-bonding the upper electrode layer 300 to the structural layer 200 on which the sensing part 50 is formed.

Figure 5:
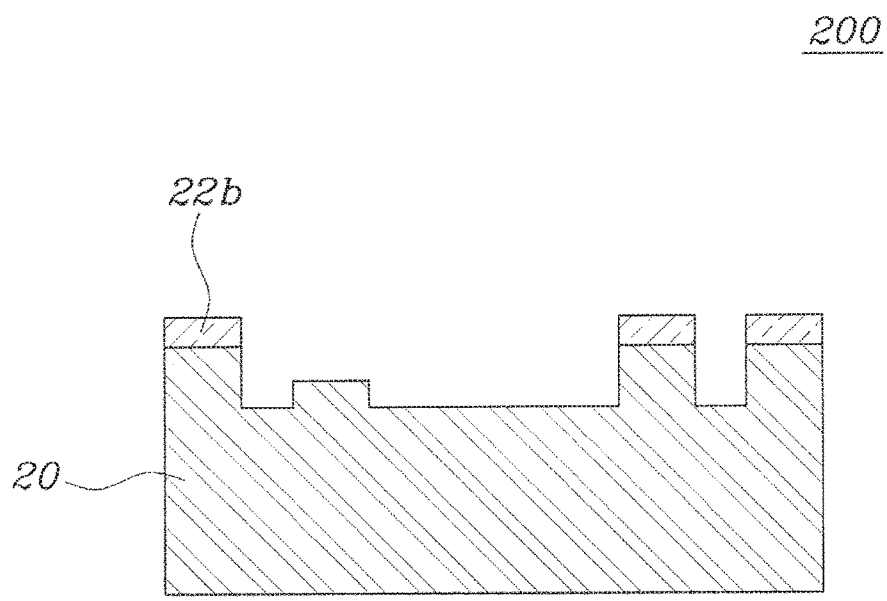

In detail, referring to FIG. 5, when forming the structural layer 200, a pattern 22b may be applied again after the etching instead of the pattern 22a that have been used for previous etching in order to etch additionally to the same thickness as the metal which is formed on a portion of the lower electrode layer 100. As the pattern 22b is applied, the metal 14c which is formed on a portion of the lower electrode layer 100 may be bonded to a portion which is etched additionally when the anodic bonding is performed. That is, the height of a portion of the structural layer 200 with which a portion of the lower electrode layer 100 on which the metal 14c is formed is in contact may be different from the height of another portion of the structural layer 200 with which a portion of the lower electrode on which the metal 14c is not formed is in contact.

Figure 2:
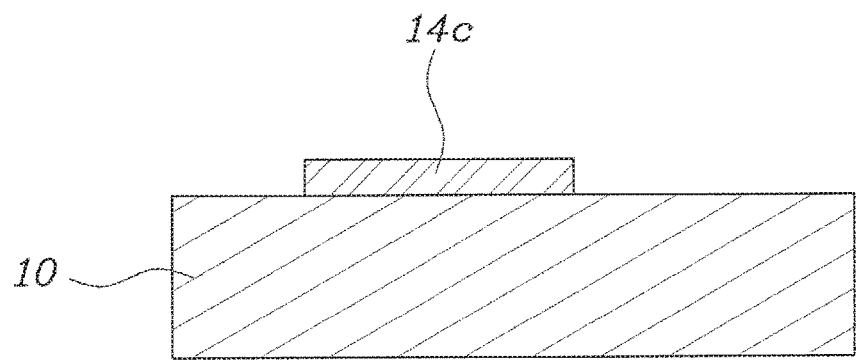
Figure 3:
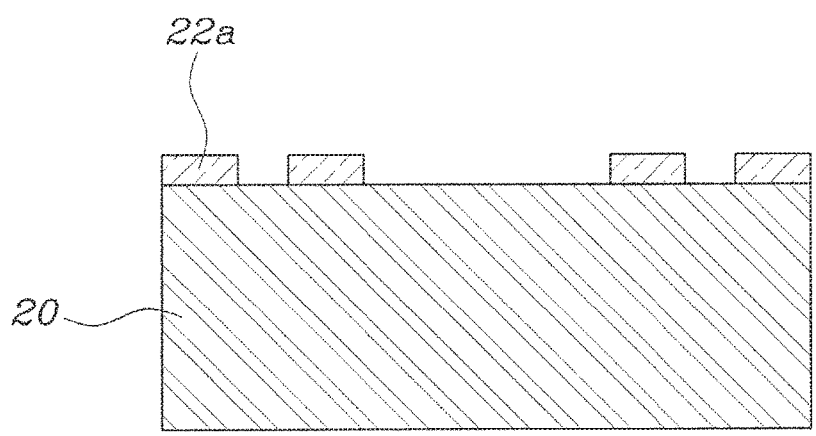
Figure 4:
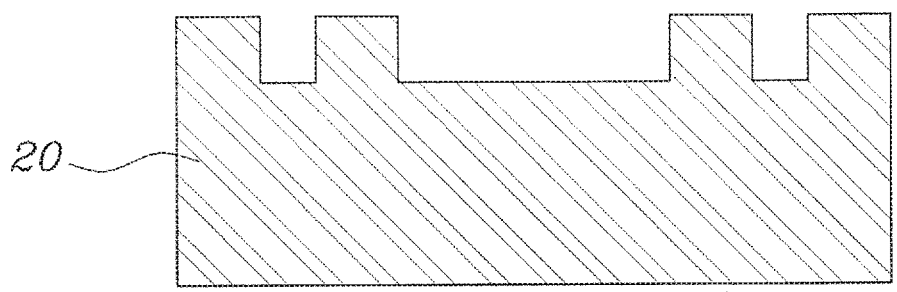

The etching of the lower electrode layer 100 shown in FIG. 1 and FIG. 2 is performed by forming a photo sensitive film pattern 12 on a glass substrate 10 and etching a portion of the glass substrate 10 using the photo sensitive film pattern 12 as a mask, and a trench is formed according to the etching. For the photo sensitive film pattern 12, a negative photo sensitive film of about 2 μm is used, and when forming the photo sensitive film pattern 12, a hard baking process applied prior to being applied. Additionally, it is preferable to form the trench at a depth of about 200 nm by performing a wet etching process for about 5 to 7 minutes using 6:1 BOE solution. Such an etching method may be applied identically during the etching processes shown in FIGS. 3 to 5.

Subsequently, the metal layers 14a, 14b, 14c are formed on the trench and the photo sensitive film pattern 12 and the photo sensitive film pattern 12 is removed by wet etching, so that only the metal 14c formed on only a portion of the lower electrode 100 remains, as shown in FIG. 2. As the metal 14c, Chrome (Cr) or Aurum (Au) may be used, and it is preferable that the thickness be about 30~60 nm and about 300~400 nm, respectively.

Figure 6:
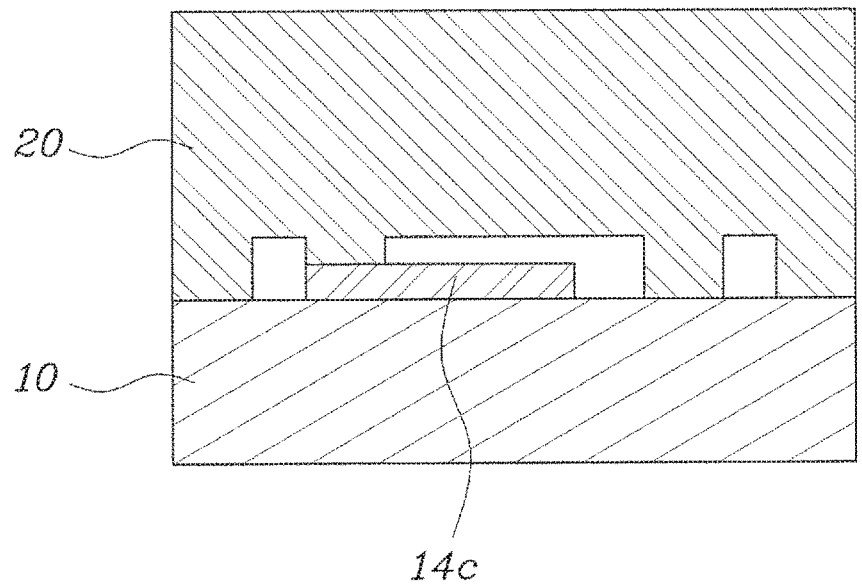

Referring to FIG. 6, anodic bonding is performed by inversing the structural layer 200 shown in FIG. 5 on the lower electrode layer 100 on a portion of which the metal 14c is formed. Such an anodic bonding is performed by applying voltage of about 700V to 900V to the lower electrode layer 100 and providing temperature of about 300 to 450° C. to a bonding portion wherein it may be useful to provide a sealed bond between a silicon wafer 20 of the structural layer 200 and the glass substrate 10. In detail, the anodic bonding may be performed for about 40 minutes at temperature of about 300° C., pressure of about 600 mbar, and voltage of about 700V.

Figure 7:
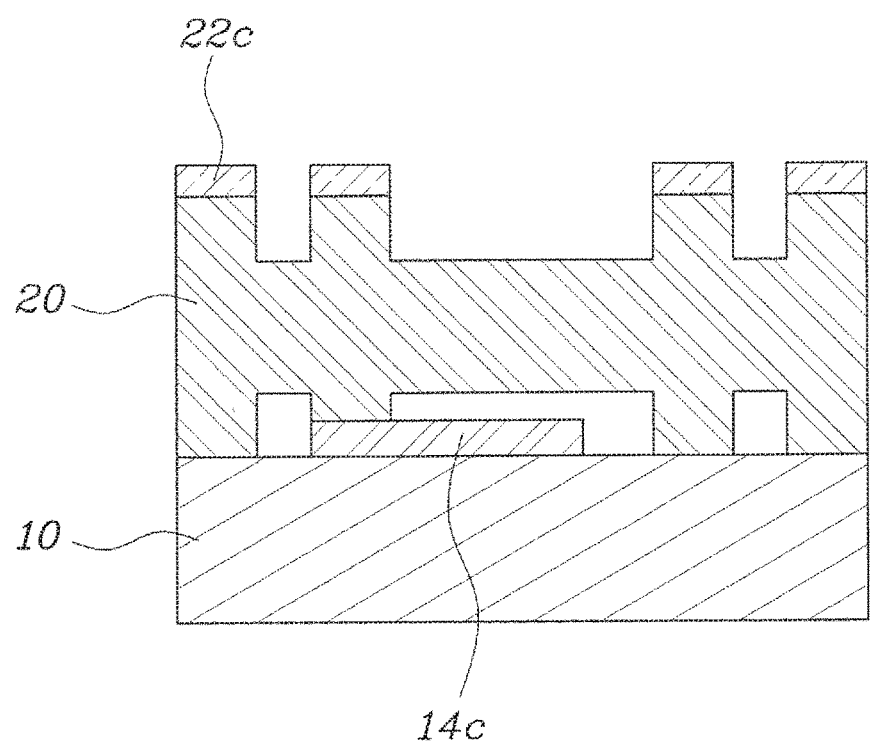
Figure 8:
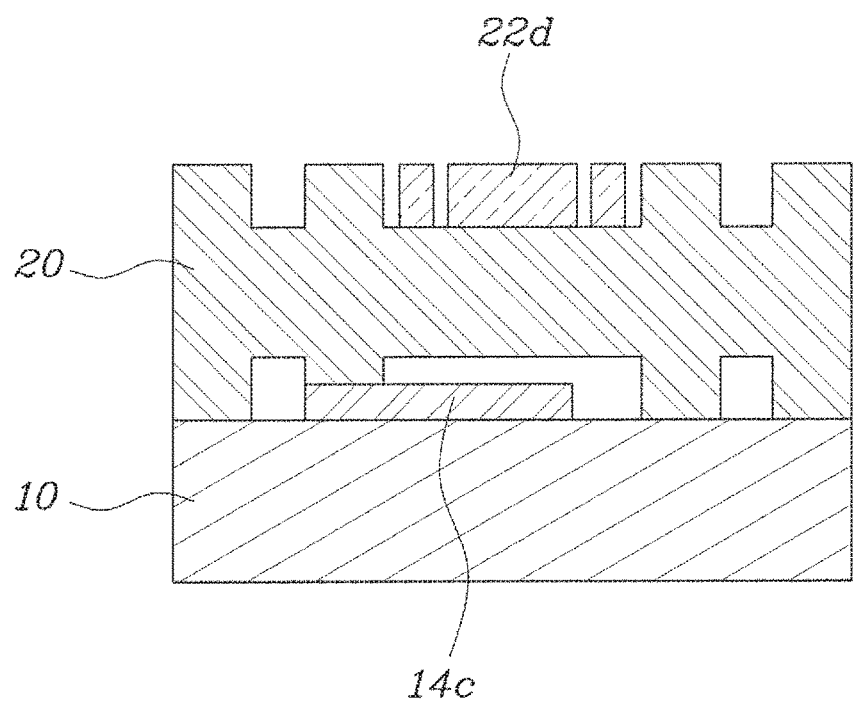
Figure 9:
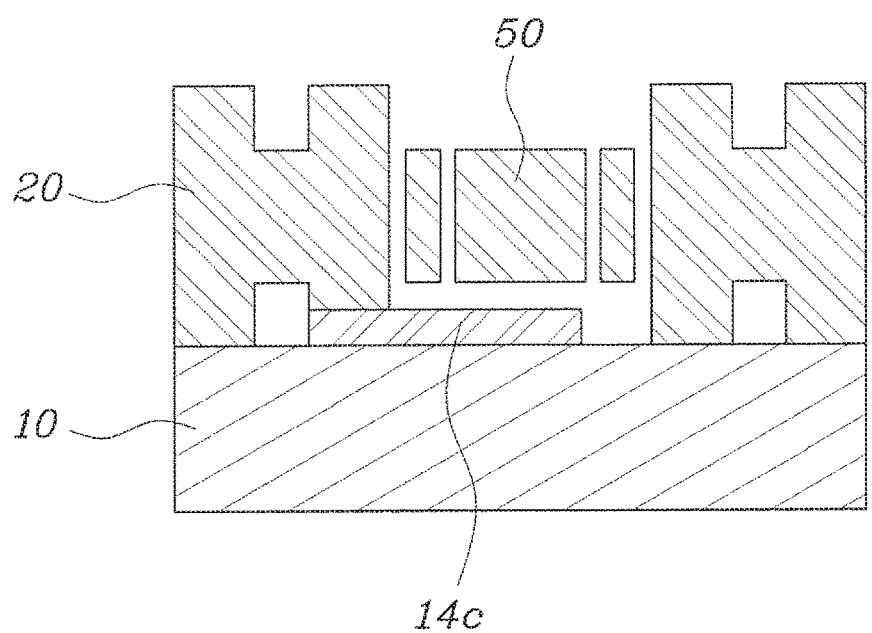

Thereafter, as shown in FIG. 7, the silicon wafer 20 may be etched by forming a pattern 22c which is identical to the pattern formed on an upper side of the silicon wafer 20 on the other side of the structural layer 200 on which the anodic bonding has not been applied. The etching method is the same as described above. After that, as shown in FIG. 8, a sensing part 50 shown in FIG. 9 is formed by forming a pattern 22d of the sensing part 50 on an etched portion and etching according to the pattern formed.

Figure 10:
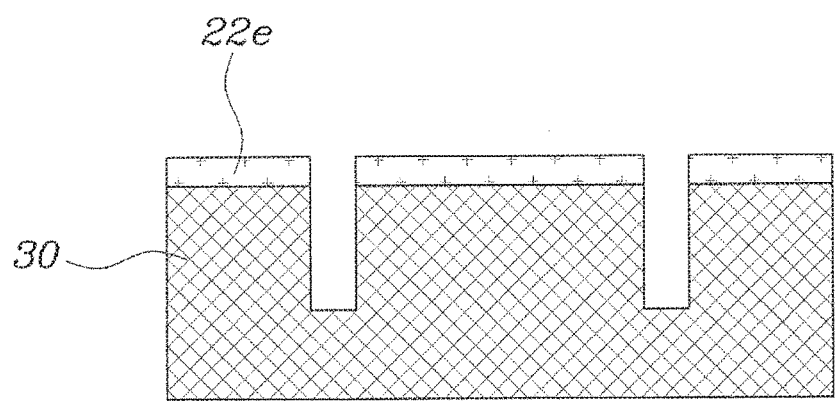
Figure 11:
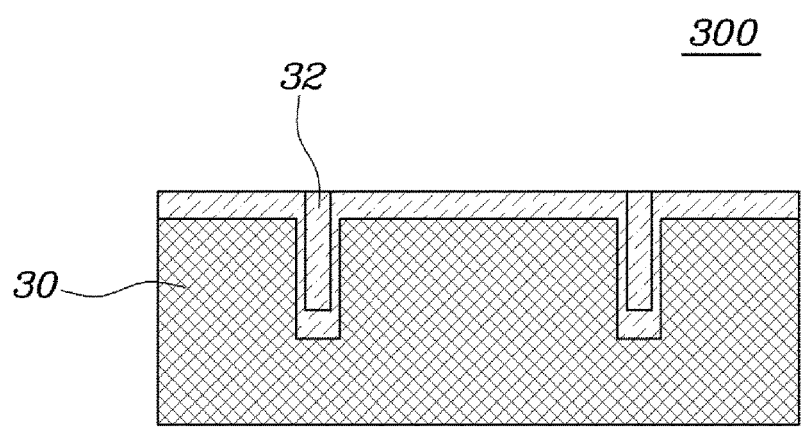
Figure 12:
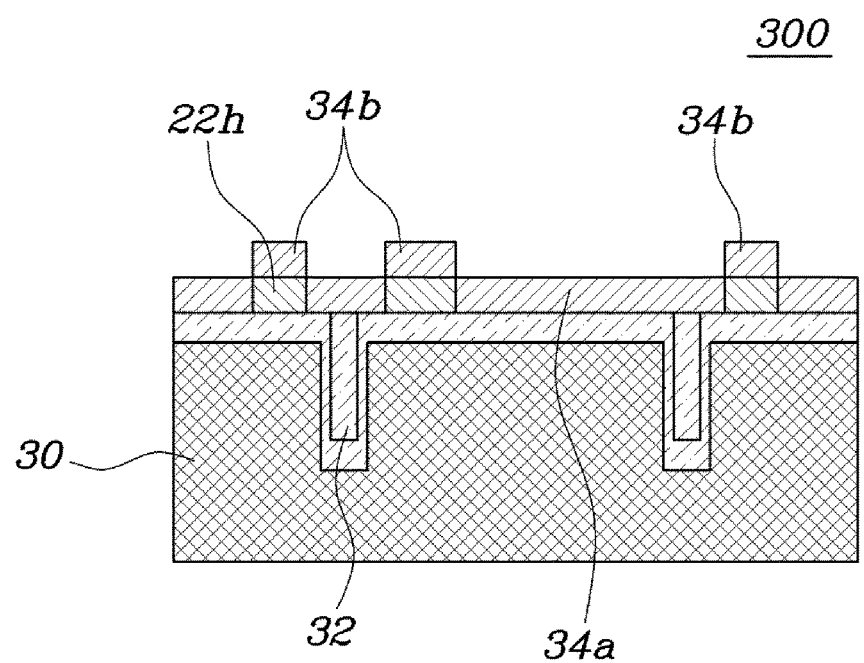

Meanwhile, as shown in FIGS. 10 to 11, in the upper electrode layer 300 a trench is formed by forming a pattern 22e on the upper wafer 30 and etching, and a plating layer 32 is formed by removing the pattern 22e and then plating copper on the upper wafer 30. After that, a metal 34a may be formed on a portion of the plating layer 32 using the pattern again. Only a portion of the entire metal layer (34a, 34b) will after the pattern is used.

Figure 13:
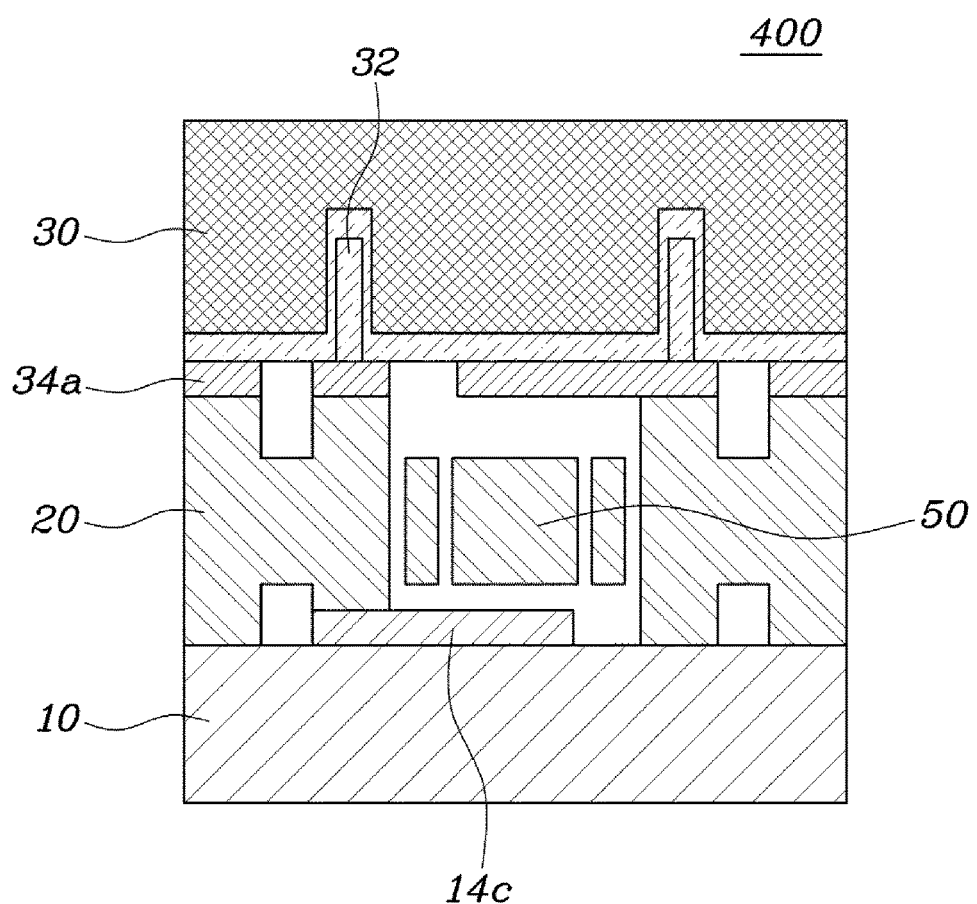
Figure 14:
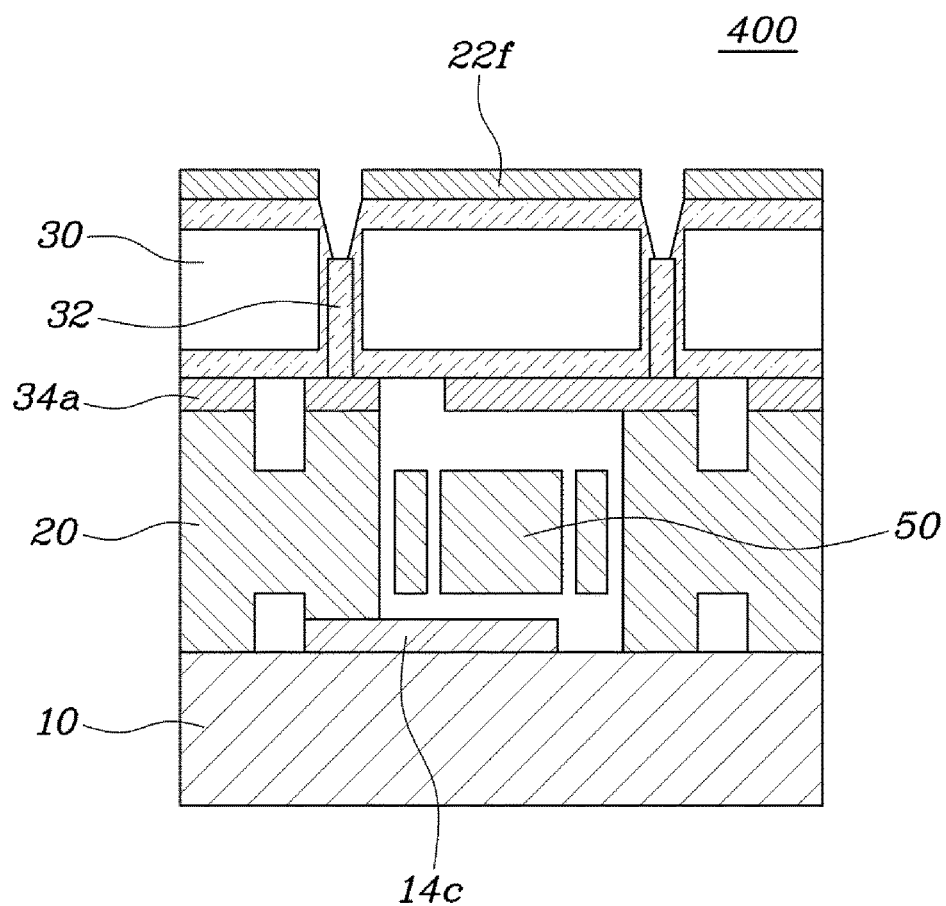
Figure 15:
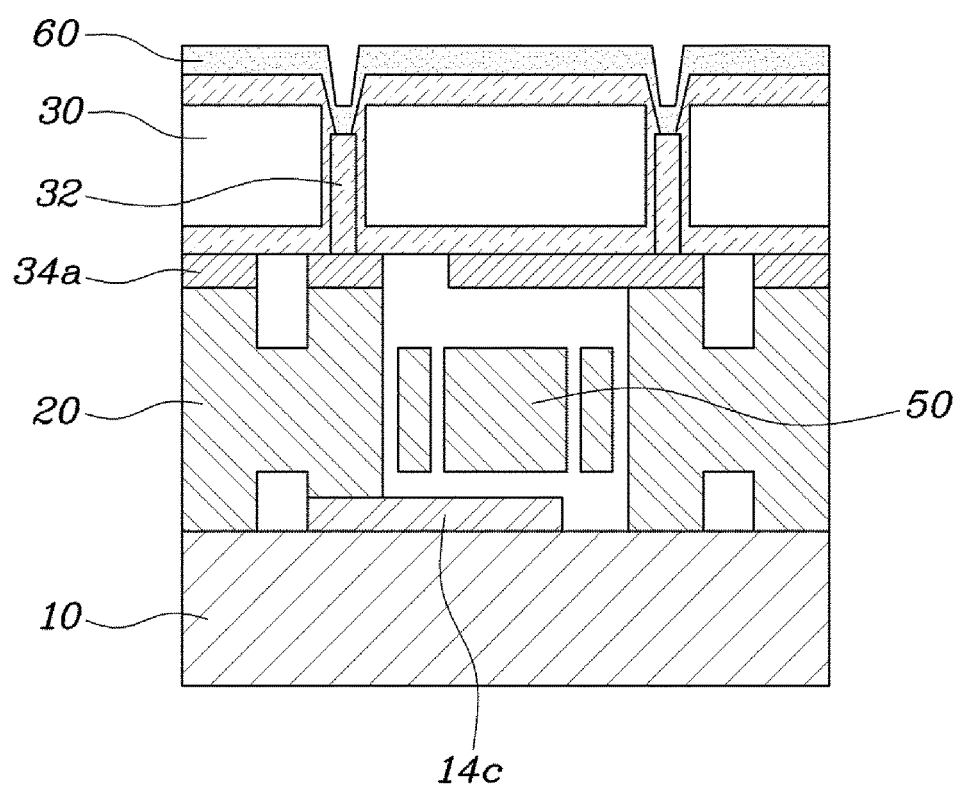
Figure 16:
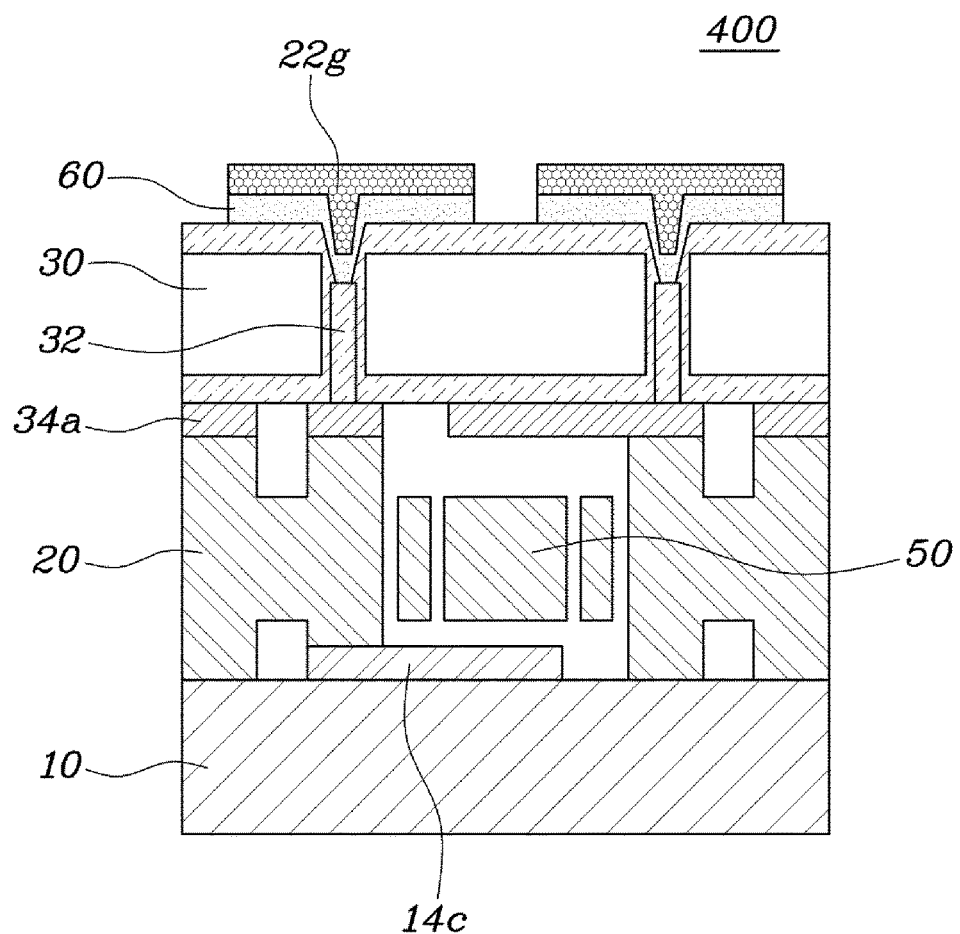

After that, as shown in FIG. 13, the upper electrode layer 300 may be eutectic bonded to the structural layer 200 on which the sensing part 50 is formed. Specifically, the eutectic bonding may be performed for about 15 minutes at temperature of about 400° C. and pressure of about 4000 mbar. That is, the temperature, pressure and time period are different between the anodic bonding and the eutectic bonding so these bondings have no influence on each other. When the lower electrode layer 100 and the structural layer 200 are eutectic bonded, and then the structural layer 200 and the upper electrode layer 300 are eutectic bonded again, eutectic temperature are identical, therefore an eutectic bonding layer which has been formed between the lower electrode layer 100 and the structural layer 200 may be melted again. Such problems may cause electrical connection of melted bonding metals or failure of the alignment between the substrates when a pressure is applied. Accordingly, according to an embodiment of the present invention, the problems described above may be resolved by bonding the lower electrode layer 100, the structural layer 200 and the upper electrode layer 300 using an anodic bonding and an eutectic bonding, respectively.

Figure 17:
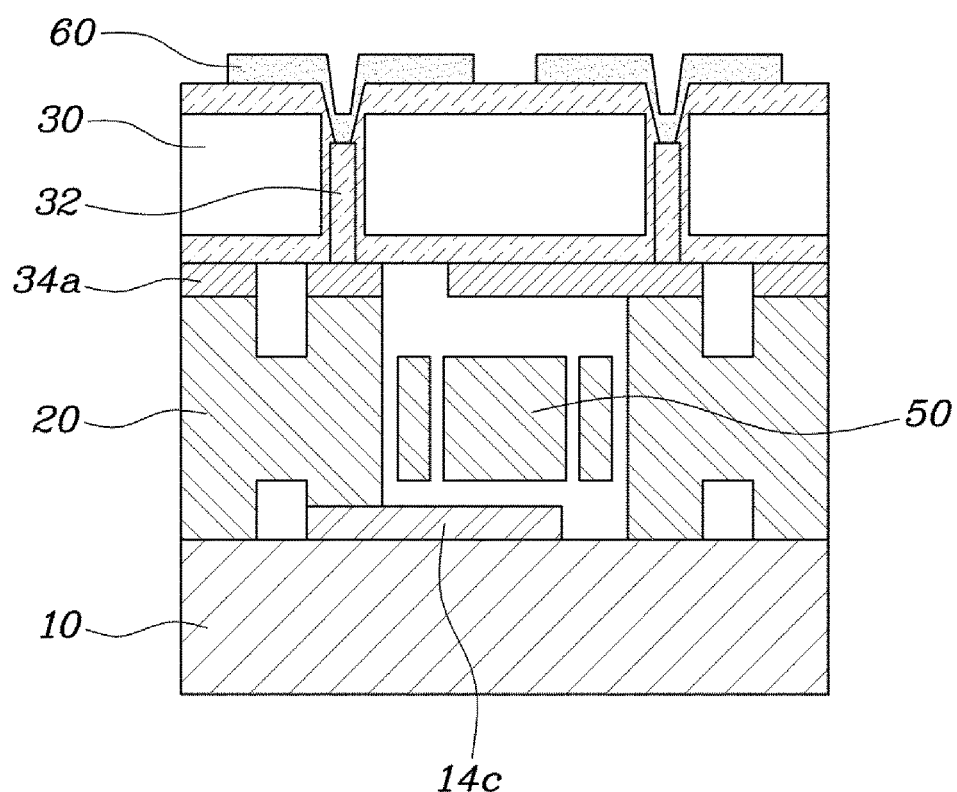

According to an additional structural layer shown in FIGS. 14 to 17, a portion to be connected to the plating layer 32 is etched using a pattern 22f. At this time, before etching, a new plating layer which is connected to an existing plating layer 32 may be formed at the opposite surface of the upper electrode layer 100 on which the plating layer 32 is formed. Additionally, a metal 60 may be deposited on the upper electrode again for an electrical wiring, and a wafer level package 400 of MEMS sensor, all processes of which are completed as shown in FIG. 17, may be obtained by forming a pattern 22a again on an electrical wiring 60 and etching the pattern.

According to a wafer level package of MEMS sensor and a method for manufacturing the same of the present invention, the respective bonding conditions are different when the lower electrode layer is bonded to a MEMS structure and the upper electrode layer is bonded to the MEMS structure, thereby not influencing to each other.

That is, when a bonding of the lower electrode layer with the MEMS structure is defined as primary bonding and a bonding of the upper electrode layer with a MEMS structure is defined as secondary bond, wafer alignment error during primary bonding which has been bonded already can be prevented when the secondary bond is performed. Additionally, after the secondary bond is completed the step of the primary bonding can be reduced or the connection of each metal can be prevented. Further, the number of metal layers to be deposited can be reduced in comparison to a conventional method in order to lower the unit price of the process.

Although the present invention was described with reference to specific embodiments shown in the drawings, it is apparent to those skilled in the art that the present invention may be changed and modified in various ways without departing from the scope of the present invention, which is described in the following claims.

What is claimed is:

1. A method for manufacturing a wafer level package of a MEMS sensor comprising:
    forming a lower electrode layer wherein a first metal is deposited on a portion of a lower glass substrate;
    forming a structural layer by etching a silicon wafer on one side surface according to a first pattern which is formed on an upper surface of the silicon wafer and then further etching the silicon wafer to a same thickness as the first metal which is formed on the portion of the lower glass substrate of the lower electrode layer;
    anodic bonding the structural layer to an upper portion of the formed lower electrode layer;
    forming a sensing part in the structural layer by etching according to a second pattern formed on a second side surface of the structural layer opposite to a first side surface of the structural layer bonded to the lower electrode layer; and
    forming an upper electrode layer by depositing a second metal on an upper wafer and eutectic bonding the upper electrode layer to the structural layer in which the sensing part is formed.

2. The method for manufacturing a wafer level package of a MEMS sensor of claim 1, wherein the upper electrode layer formed by depositing the second metal on the upper wafer is formed by etching along a fourth pattern which is formed on the upper wafer and depositing a third metal on an upper portion of a plating layer for plating the upper wafer etched.

3. The method for manufacturing a wafer level package of a MEMS sensor of claim 2, wherein eutectic bonding with the structural layer is performed by eutectic bonding the upper electrode layer to one surface of the structural layer in which the sensing part is formed.

* * * * *